United States Patent
Matsumura

(10) Patent No.: US 7,220,530 B2
(45) Date of Patent: May 22, 2007

(54) LIGHT SENSITIVE PLANOGRAPHIC PRINTING PLATE MATERIAL

(75) Inventor: Toshiyuki Matsumura, Fujino-machi (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 85 days.

(21) Appl. No.: 11/052,853

(22) Filed: Feb. 9, 2005

(65) Prior Publication Data

US 2005/0181301 A1     Aug. 18, 2005

(30) Foreign Application Priority Data

Feb. 12, 2004   (JP) ............................. 2004-034717

(51) Int. Cl.
*G03F 7/029* (2006.01)

(52) U.S. Cl. .................. 430/157; 430/176; 430/280.1; 430/281.1

(58) Field of Classification Search ................ 430/157, 430/176, 280.1, 281.1, 288.1
See application file for complete search history.

(56) References Cited

U.S. PATENT DOCUMENTS

2004/0229165 A1*  11/2004  Munnelly et al. ........ 430/281.1

* cited by examiner

*Primary Examiner*—John S. Chu
(74) *Attorney, Agent, or Firm*—Finnegan, Henderson, Farabow, Garrett & Dunner, L.L.P.

(57) ABSTRACT

Disclosed is a light sensitive planographic printing plate material comprising a hydrophilic support and provided thereon, a light sensitve layer containing (A) an infrared absorbing dye, (B) a radical generating agent, and (C) a radically polymerizable compound, the light sensitve layer being an outermost layer, wherein the radical generating agent is selected from the group consisting of a sulfonium salt, a iodonium salt and a diazonium salt, and the radically polymerizable compound is a radically polymerizable oxirane compound having an oxirane ring in the molecule.

8 Claims, No Drawings

LIGHT SENSITIVE PLANOGRAPHIC PRINTING PLATE MATERIAL

FIELD OF THE INVENTION

The present invention relates to a light sensitive planographic printing plate material with high sensitivity providing a planographic printing plate with high printing durability, employing a near infrared light.

BACKGROUND OF THE INVENTION

In recent years, as a printing plate for off-set printing, a large number of CTP systems have been developed and put into practical use, which imagewise exposes directly to a planographic printing plate material employing laser light based on digital image data to record an image on the material. As the CTP systems, there are a silver salt system, a radical polymerization system and a thermal system, which differ in characteristics. With development of a solid laser or semiconductor laser with high output power which emits near infrared light, CTP systems recording with near infrared light, so-called thermal CTP systems has been developed and widely applied.

A planographic printing plate material (printing plate material for CTP) used in the thermal CTP is disclosed in U.S. Pat. No. 5,340,699 which comprises an image recording layer containing an infrared absorbing agent, an acid generating agent, a resol resin, and a novolak resin. In this printing plate material for CTP, imagewise exposure produces an acid is imagewise produced at exposed portions due to interaction of the infrared absorbing agent and the acid generating agent, and heat treatment which follows cross-links the resol resin by action of the acid. When the resulting material is developed with an alkali developer, the unexposed portions having higher alkali solubility are removed with an alkali developer, while the exposed portions (cross-linked portions) lose alkali solubility and imagewise remain to form an image. This system requires heat treatment which heats at 140 to 200° C. for 50 to 120 seconds for accelerating the cross-linking reaction at exposed portions, and has problems in energy consumption and processing time.

Japanese Patent O.P.I. Publication No. 2001-175006 discloses a process comprising the step of (a) imagewise exposing to infrared laser a negative-working image formation material comprising an image recording layer containing an infrared absorbing dye, a radical generating agent, a radically polymerizable compound, and a binder polymer, and (b) then heating the resulting material at 60 to 120° C. for 1 to 20 seconds, wherein heating treatment is carried out after exposure. This process, although it conducts heat treatment at relatively low temperature for relatively short time, improves printing durability. However, the heat treatment is required, and a printing plate material obtained by the process does not provide satisfactory printing durability.

Japanese Patent Publication No. 2002-537419 discloses a planographic printing plate material comprising an image recording layer containing a specific polycarboxylic acid. This planographic printing plate material provides high sensitivity without lowering storage stability, but still requires heat treatment at 90° C. for about 60 seconds.

Japanese Patent O.P.I. Publication Nos. 2002-278057 and 2003-5363 disclose a printing plate material comprising a specific cyanine dye as an infrared absorbing agent, in which polymerization efficiency is increased and printing durability is increased without heating. This material provides a certain effect but needs to be improved in printing durability.

A printing plate material comprising a specific onium salt as a radical generating agent is disclosed (see for example, Japanese Patent O.P.I. Publication Nos. 2002-341519 and 2003-76010) in which polymerization efficiency is increased and printing durability is increased without heating. This material also provides a certain effect but needs to be improved in printing durability.

SUMMARY OF THE INVENTION

An object of the invention is to provide a light sensitive planographic printing plate material with high sensitivity, which is exposed to a near infrared light to provide a planographic printing plate with high printing durability, wherein any heat treatment after exposure is not required.

DETAILED DESCRIPTION OF THE INVENTION

The above object has been attained by one of the following constitutions:

1. A light sensitive planographic printing plate material comprising a hydrophilic support and provided thereon, a light sensitive layer containing (A) an infrared absorbing dye, (B) a radical generating agent, and (C) a radically polymerizable compound, the light sensitive layer being an outermost layer, wherein the radical generating agent is selected from the group consisting of a sulfonium salt, a iodonium salt and a diazonium salt, and the radically polymerizable compound is a radically polymerizable oxirane compound having an oxirane ring in the molecule.

2. The light sensitive planographic printing plate material of item 1 above, wherein the oxirane compound is an oxirane compound represented by the following formula (1),

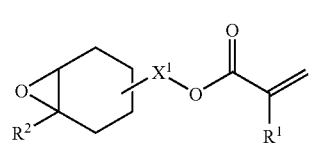

Formula (1)

wherein $R^1$ represents a hydrogen atom or a methyl group; $R^2$ represents a hydrogen atom or an alkyl group having a carbon atom number of not more than 6; and $X^1$ represents a single bond, a straight chained or branched alkylene group having a carbon atom number of from 1 to 8, an alkylene group in which a carbonyl group, an oxygen atom or a sulfur atom is intervened in the alkylene skeleton, an arylene group or an aralkylene group.

3. The light sensitive planographic printing plate material of item 1 above, wherein the light sensitive layer further contains a radically polymerizable oxetane compound having an oxetane ring in the molecule as the radically polymerizable compound.

4. The light sensitive planographic printing plate material of item 3 above, wherein the oxetane compound is an oxetane compound represented by the following formula (2),

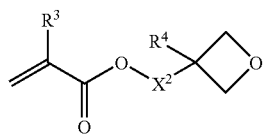

Formula (2)

wherein $R^3$ represents a hydrogen atom or a methyl group; $R^4$ represents a hydrogen atom or an alkyl group having a carbon atom number of not more than 4; and $X^2$ represents a single bond, a straight chained or branched alkylene group having a carbon atom number of from 1 to 8, an alkylene group in which a carbonyl group, an oxygen atom or a sulfur atom is intervened in the alkylene skeleton, an arylene group or an aralkylene group.

5. The light sensitive planographic printing plate material of item 1 above, wherein the light sensitive layer contains the infrared absorbing dye in an amount of from 0.5 to 15% by weight, the radical generating agent in an amount of from 0.1 to 20% by weight, and the radically polymerizable oxirane compound in an amount of from 30 to 70% by weight.

6. The light sensitive planographic printing plate material of item 1 above, wherein the light sensitive layer further contains a polymer binder.

7. The light sensitive planographic printing plate material of item 1 above, wherein the infrared absorbing dye is a dye having an absorption band in an infrared wavelength region of from 700 to 1200 nm.

8. The light sensitive planographic printing plate material of item 7 above, wherein the infrared absorbing dye is a cyanine dye.

9. The light sensitive planographic printing plate material of item 1 above, wherein the light sensitive layer further contains, as the radical generating agent, a sulfone compound, a halogen compound or an iron arene complex.

1-1. A light sensitive planographic printing plate material comprising a hydrophilic support and provided thereon, a light sensitive layer containing (A) an infrared absorbing dye, (B) a radical generating agent, and (C) a radically polymerizable compound, the light sensitive layer being an outermost layer, wherein the radical generating agent is selected from the group consisting of a sulfonium salt, a iodonium salt and a diazonium salt, and the radically polymerizable compound is an oxirane compound having an oxirane ring in the molecule.

1-2 The light sensitive planographic printing plate material of item 1-1 above, wherein the oxirane compound is a compound represented by formula (1) above.

1-3. The light sensitive planographic printing plate material of item 1-1 above, wherein the light sensitive layer further contains an oxetane compound having an oxetane ring in the molecule as the radically polymerizable compound.

1-4. The light sensitive planographic printing plate material of item 1-3 above, wherein the oxetane compound is a compound represented by formula (2) above.

The present invention will be explained in detail below.

(A) Infrared Absorbing Dye

The infrared absorbing dye in the invention is a dye having an absorption band in an infrared wavelength region of from 700 to 1200 nm. The dye is not specifically limited, but as the dyes in the invention, there are infrared absorbing agents, light-to-heat conversion materials, near infrared dyes, or pigments disclosed in U.S. Pat. No. 5,340,699, Japanese Patent O.P.I. Publication No. 2001-175006, Japanese Patent Publication No. 2002-537419, and Japanese Patent O.P.I. Publication Nos. 2002-341519, 2003-76010, 2002-278057, 2003-5363, 2001-125260, 2002-23360, 2002-40638, 2002-62642, and 2002-2787057.

As the dyes in the invention, dyes such as cyanine dyes, squalirium dyes, oxonol dyes, pyrylium dyes, thiopyrylium dyes, polymethine dyes, oil soluble phthalocyanine dyes, triarylamine dyes, thiazolium dyes, oxazolium dyes, polyaniline dyes, polypyrrole dyes and polythiophene dyes can be preferably used.

Besides the above, pigments such as carbon black, titanium black, iron oxide powder, and colloidal silver can be preferably used. Cyanine dyes as dyes, and carbon black as pigments are especially preferred, in view of extinction coefficient, light-to-heat conversion efficiency and cost.

Preferred examples of the cyanine dyes will be listed below.

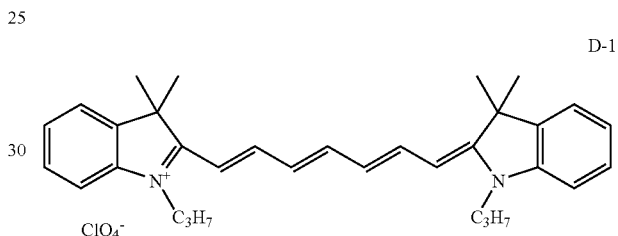

D-1

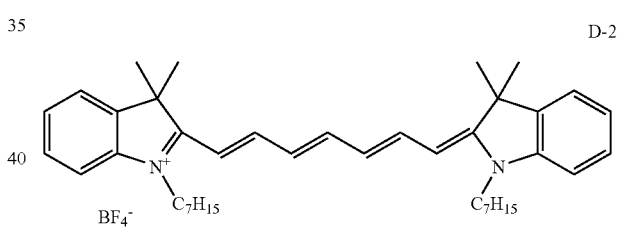

D-2

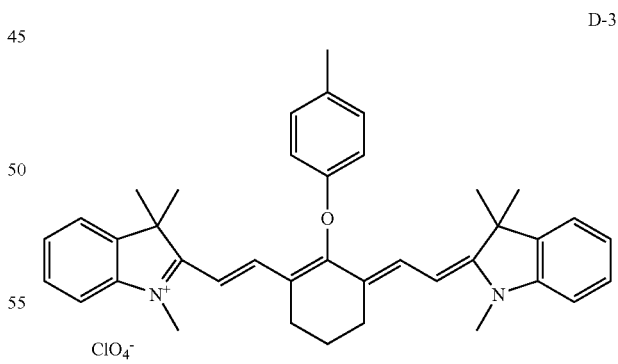

D-3

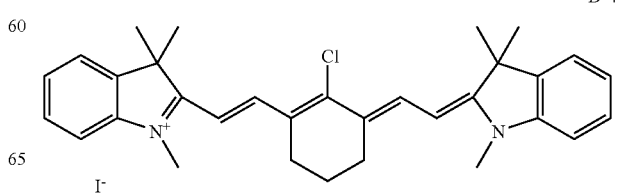

D-4

-continued
D-5
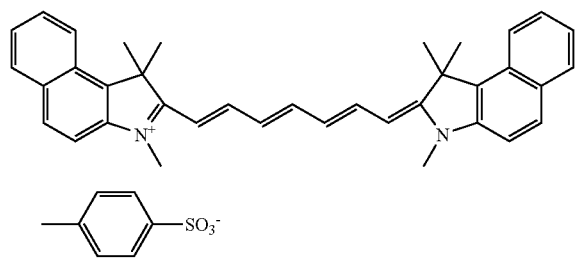
D-6
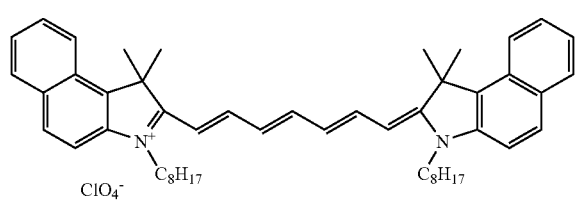
D-7
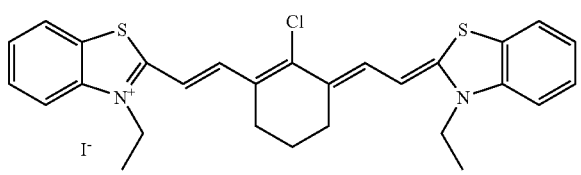
D-8
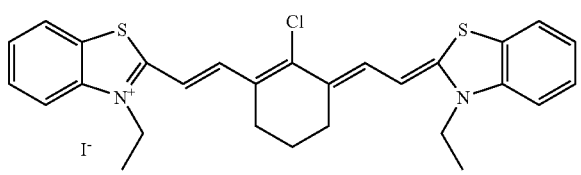
D-9
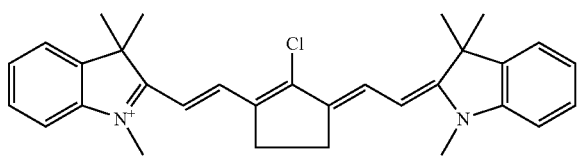
D-10
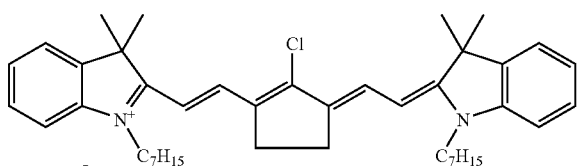
-continued
D-11
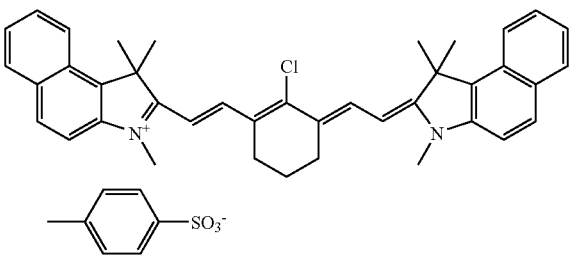
D-12
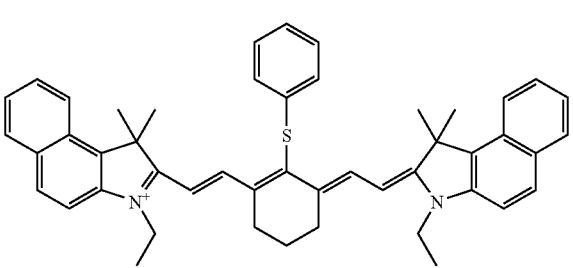
D-13
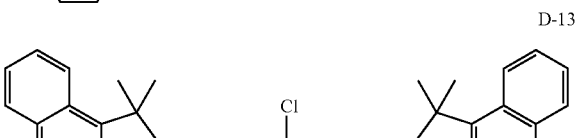
D-14
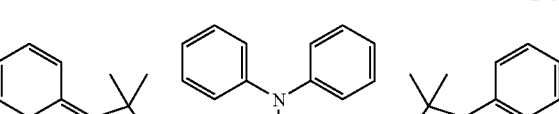
D-15
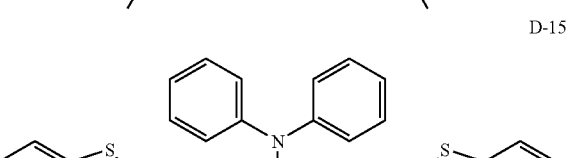
D-16
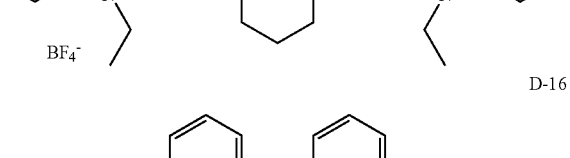

-continued

D-17
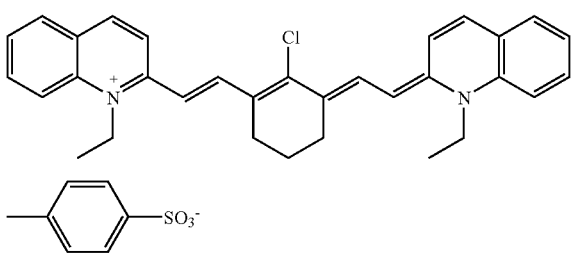

D-18
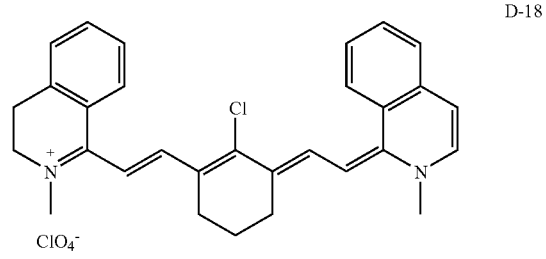

D-19
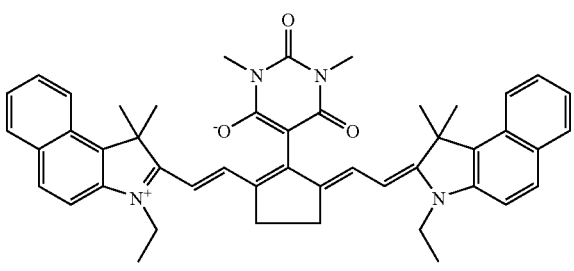

D-20
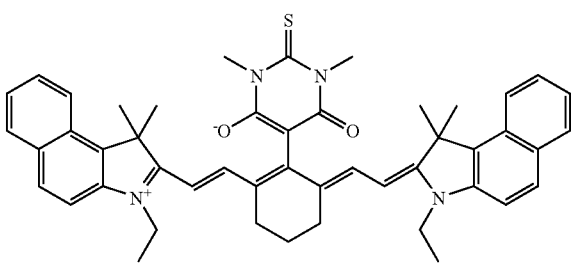

The content in the light sensitive layer of the infrared absorbing dye in the invention is preferably from 0.5 to 15% by weight, and more preferably from 1 to 10% by weight. Further, the content in the light sensitive layer of the infrared absorbing dye is different due to extinction coefficient of the dye, but is preferably an amount giving a reflection density of from 0.3 to 3.0, and preferably from 0.5 to 2.0. In order to obtain the above reflection density, the content in the light sensitive layer of for example, the cyanine dye is 10 to 100 mg/m$^2$.

(B) Radical Generating Agent

The light sensitive planographic printing plate material of the invention comprises a radical generating agent (hereinafter also referred to as the radical generating agent in the invention) selected from a sulfonium salt, a diazonium salt and an iodonium salt, as (B) a radical generating agent. As the sulfonium salt, diazonium salt and iodonium salt, there are, for example, salts of a sulfonium ion, a diazonium ion and an iodonium ion with $B(C_6F_5)_4^-$, $BF_4^-$, $PF_6^-$, $AsF_6^-$, $SbF_6^-$, or $CF_3SO_3^-$.

A triarylsulfonium salt is preferred as the sulfonium salt in increasing storage stability or in minimizing unreacted polymerizable compound.

As the sulfonium salt, a sulfonium salt represented by formula [1], [2], [3] or [4], is preferred in view of solubility, sensitivity and storage stability.

Formula [1]
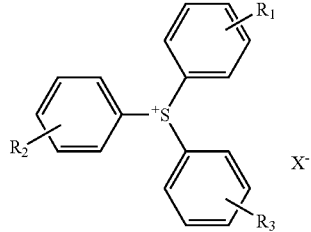

Formula [2]
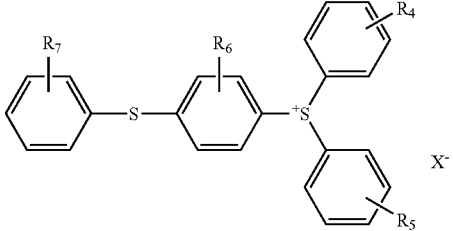

Formula [3]
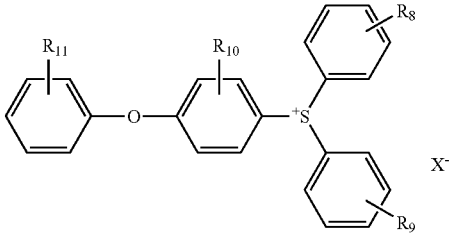

Formula [4]
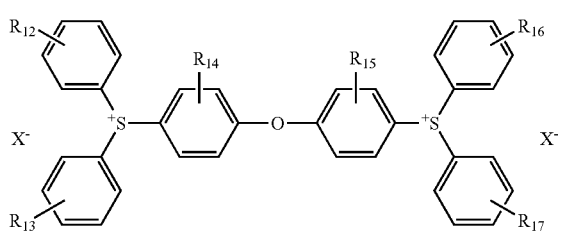

In formulae [1] through [4] above, $R_1$ through $R_{17}$ independently represent a hydrogen atom or a substituent, provided that $R_1$ through $R_3$ are not simultaneously hydrogen atoms, $R_4$ through $R_7$ are not simultaneously hydrogen atoms, $R_8$ through $R_{11}$ are not simultaneously hydrogen atoms, and $R_{12}$ through $R_{17}$ are not simultaneously hydrogen atoms; and $X^-$ represents an anion.

Examples of the substituent represented by $R_1$ through $R_{17}$ include an alkyl group such as a methyl group, an ethyl group, a propyl group, an isopropyl group, a butyl group, an isobutyl group, a t-butyl group, a pentyl group, or a hexyl group; an alkoxy group such as a methoxy group, an ethoxy group, a propoxy group, an isopropyl group, a butoxy group, a hexyloxy group, a decyloxy group or a dodecyloxy group; a carbonyl group such as an acetoxy group, a propionyloxy group, a decylcarbonyloxy group, a dodecylcarbonyloxy group, a methoxycarbonyl group, an ethoxycarbonyl group or a benzoyloxy group; a phenylthio group; a halogen atom such as fluorine, chlorine, bromine or iodine; a cyano group; a nitro group; and a hydroxyl group.

$X^-$ represents an anion. Examples thereof include a halogen ion such as $F^-$, $Cl^-$, $Br^-$ or $I^-$, $B(C_6F_5)_4^-$, $R_{18}COO^-$, $R_{19}SO_3^-$, $SbF_6^-$, $AsF_6^-$, $PF_6^-$, and $BF_4^-$, in which $R_{18}$ and $R_{19}$ independently represent an alkyl group such as a methyl group, an ethyl group, a propyl group or a butyl group; an alkyl group having, as a substituent, a halogen atom such as fluorine, chlorine, bromine or iodine, a nitro group, a cyano group, a methoxy group or an ethoxy group; or a phenyl group. Among these, $B(C_6F_5)_4^-$ and $PF_6^-$ are preferred in view of safety.

The above compounds can be easily synthesized according to commonly known methods, for example, in the same manner as the photolytically acid generating agent described in "THE CHEMICAL SOCIETY OF JAPAN", Vol. 71, No. 11 (1998), and "Imejinguyou Yukizairyo", edited by Yuki Erekutoronikus Zairyokenkyukai, and published by Bunshin Shuppan (1993).

Among the sulfonium salts represented by formulae [1] through [4], sulfonium salts [5] through [13] listed below are especially preferred. In formulae [5] through [13], $X^-$ represents an anion, and examples thereof are the same as those denoted in $X^-$ of formulae [1] through [4].

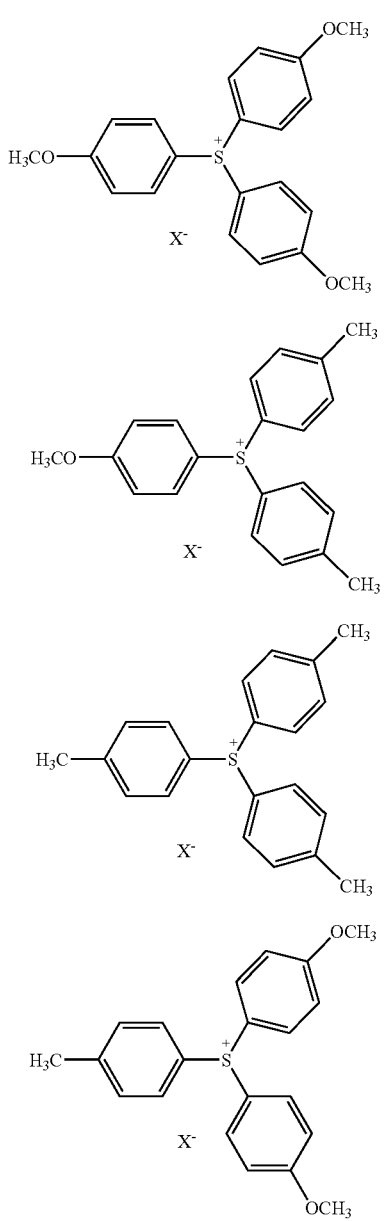

In addidtion to the exemplidied compounds represented by formulae [5] through [13], the following ones are listed.

Exemplified compound S-1
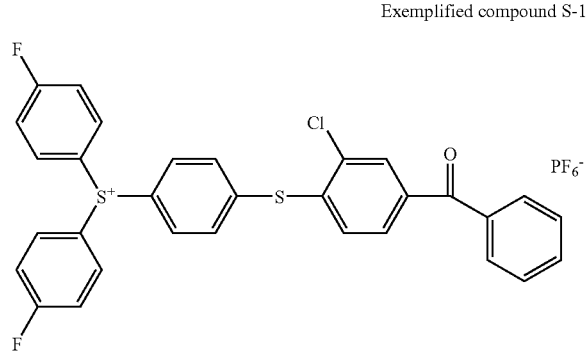
Exemplified compound S-2
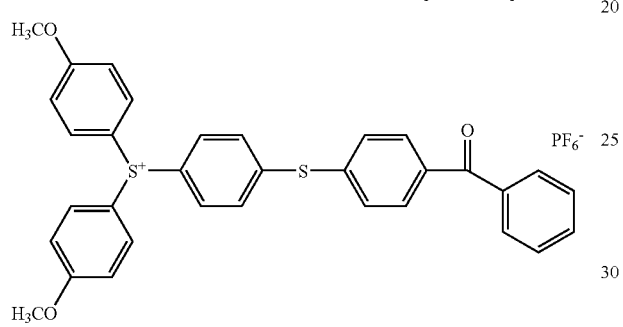
Exemplified compound S-3
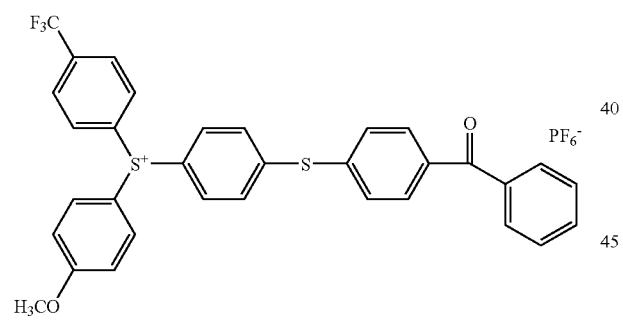
Exemplified compound S-4
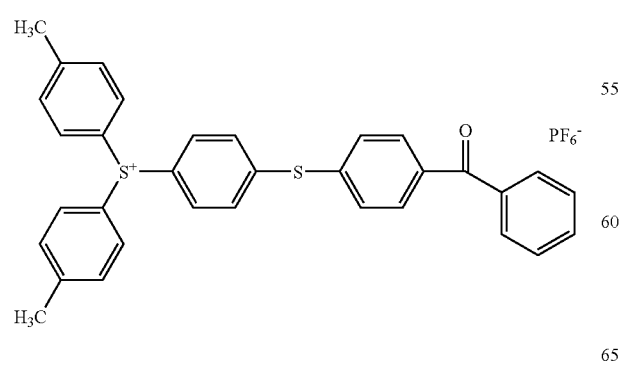
-continued
Exemplified compound S-5
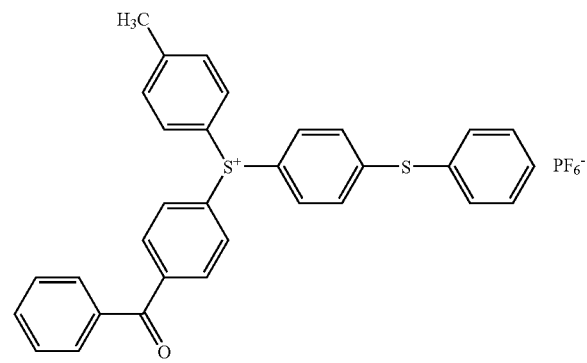
Exemplified compound S-6
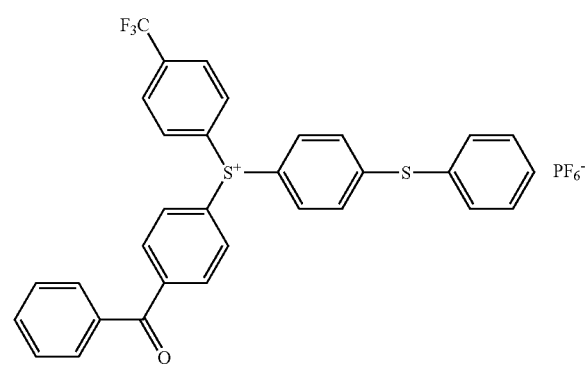
Exemplified compound S-7
Exemplified compound S-8
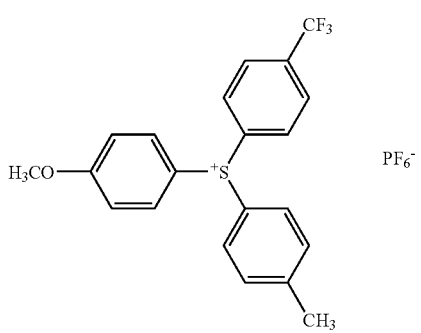

Exemplified compound S-9

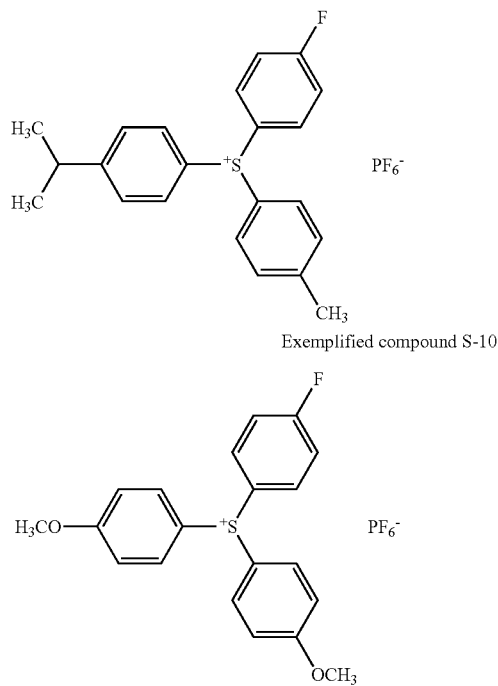

Exemplified compound S-10

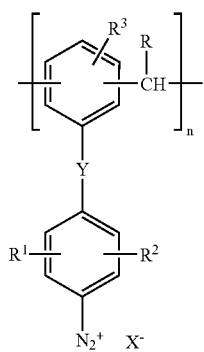

As the diazonium salt, there is, for example, a diazo resin, which is a condensation product of an aromatic diazonium salt with formaldehyde or acetaldehyde. Examples of the diazo resin include a hexafluorophosphate, a tetrafluoroborate, perchlorate or periodate salt of a condensation product of p-diazophenylamine with formaldehyde or acetaldehyde, an inorganic salt of the condensation product, and a sulfonate salt of the condensation product disclosed in U.S. Pat. No. 3,300,309.

The preferred diazo resin is a co-condensation product of diazodiphenylamine with an aromatic compound having a carbonyl group or a sulfonyl group in the molecule. A co-codensation ratio by mole of diazodiphenylamine to the aromatic compound is preferably from 30:70 to 95:5. The especially preferred is a co-condensation product of diazodiphenylamine with p-hydroxybenzoic acid having a diazodiphenylamine to p-hydroxybenzoic acid ratio by mole of from 50:50 to 80:20.

In the invention, the diazo resin is preferably a condensation resin obtained by condensation of an aromatic diazonium compound and a carbonyl compound. The condensation resin has preferably a diazo resin having the structure represented by the following formula (I) or (II):

Formula (I)

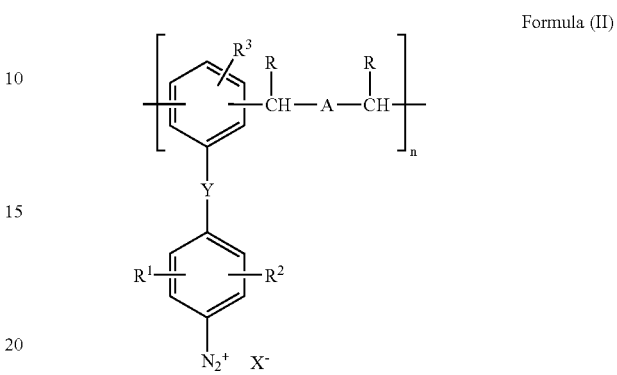

wherein R represents a hydrogen atom, an alkyl group or a phenyl group; $R^1$, $R^2$ and $R^3$ independently represent a hydrogen atom, an alkyl group or an alkoxy group; $X^-$ represents an anion; Y represents —NH—, —O— or —S—; and n represents an integer.

Formula (II)

$$\left[ \begin{array}{c} R^3 \\ \underset{Y}{\underset{|}{\overset{|}{\text{CH}}}} - A - \underset{|}{\overset{R}{\text{CH}}} \\ \underset{R^1 \underset{\phantom{X}}{\overset{\phantom{X}}{\rule{0pt}{0pt}}}}{\underset{N_2^+ \; X^-}{\rule{0pt}{0pt}}} R^2 \end{array} \right]_n$$

wherein A represents a divalent aromatic group; R, $R^1$, $R^2$, $R^3$, $X^-$, Y and n independently represent the same as denoted above.

The aromatic diazonium compound units contained in the above diazo resin represented by formula (I) or (II) include the diazonium salts as disclosed in Japanese Patent Publication No. 49-48001, and is preferably diphenylamine-4-diazonium salts. The diphenylamine-4-diazonium salts are derived from 4-amino-diphenylamines. The 4-amino-diphenylamines include 4-aminodiphenylamine, 4-amino-3-methoxydiphenylamine, 4-amino-2-methoxydiphenylamine, 4'-amino-2-methoxydiphenylamine, 4'-amino-4-methoxydiphenylamine, 4-amino-3-methyldiphenylamine, 4-amino-3-ethoxydiphenylamine, 4-amino-3-(β-hydroxyethoxy)diphenylamine, 4-aminodiphenylamine-2-sulfonic acid, 4-aminodiphenylamine-2-carboxylic acid and 4-aminodiphenylamine-2'-carboxylic acid. The preferable are 4-aminodiphenylamine and 4-amino-3-methoxydiphenylamine.

Examples of the aromatic compound used to provide the aromatic group A in formula (II) include m-chlorobenzoic acid, diphenylacetic acid, phenoxyacetic acid, p-methoxyphenylacetic acid, p-methoxybenzoic acid, 2,4-dimethoxybenzoic acid, p-phenoxybenzoic acid, 4-anilinobenzoic acid, 4-(m-methoxyanilino) benzoic acid, 4-(p-methylbenzoyl) benzoic acid, 4-(p-methylanilino) benzoic acid, phenol, xylenol, resorcin, 2-methylresorcin, methoxyphenol, ethoxyphenol, catechol, phloroglucin, p-hydroxyethylphenol, naphthol, pyrrogallol, hydroquinone, p-hydroxybenzyl alcohol, 4-chlororesorcin, biphenyl-4,4'-diol, 1,2,4-benzene triol, bisphenol A, 2,4-dihydroxy benzophenone, 2,3,4-trihydroxy benzophenone, p-hydroxyacetophenone, 4,4'-dihydroxydiphenyl ether, 4,4'-dimethoxydiphenyl ether, 4,4'-dihydroxydiphenyl amine, 4,4'-dihydroxydiphenyl sulfide, cumylphenol, chlorophenol, bromophenol, salicylic acid, p-hybroxybenzoic acid , 2-methyl-4-hydroxybenzoic acid, 2,4-dihydroxybenzoic acid, 2,6-dihydroxybenzoic acid, 3,5-dihydroxybenzoic acid, 4-chloro-2,6-dihydroxybenzoic acid, 4-methoxy-2,6-dihydroxybenzoic acid, gallic acid, phloroglucinol carboxylic acid, N-(4-hydroxyphenyl)methacryl amide, N-(4-hydroxyphenyl)acryl amide, cinnamic acid, methyl cinnamate, ethyl cinnamate, p-hydroxy cinnamic acid, styrene, hydroxy styrene, stilbene, 4- hydroxy stilbene, 4,4'-dihydroxy stilbene, 4-carboxy stilbene, 4,4'-dicarboxy stilbene, diphenyl ether, diphenyl ether, diphenyl thioether, 4-methoxydiphenyl ether, 4-methoxydiphenyl amine, and 4-methoxydiphenyl thioether.

Of these diazo resins preferred is a diazo resin having a carboxyl group in the molecule. The diazo resin having a carboxyl group in the molecule is preferably a diazo resin of formula (II), in which the aromatic group represented by A has a carboxyl group. Preferred examples of the aromatic compound used to provide the aromatic group A having a carboxyl group in formula (II) include preferably p-hydroxybenzoic acid, p-methoxybenzoic acid, p-hydroxycinnamic acid, and phenoxyacetic acid.

The diazo resin is obtained by polycondensation of an aromatic diazonium salt and optionally, an aromatic compound providing the aromatic group represented by A in formula (II), with an active carbonyl compound such as paraformaldehyde, acetoaldehyde, benzaldehyde, acetone or acetophenone in a sulfuric acid, phosphoric acid or hydrochloric acid solution, according to a conventional method as disclosed in Photo. Sci. Eng., Vol. 17, 33 (1973), U.S. Pat. Nos. 2,063,631 and 2,679,498, and Japanese Patent Publication No. 49-48001.

Examples of the iodonium salt include salts of an iodonium ion having the following chemical structure with $B(C_6F_5)_4^-$, $BF_4^-$, $PF_6^-$, $AsF_6^-$, $SbF_6^-$, or $CF_3SO_3^-$.

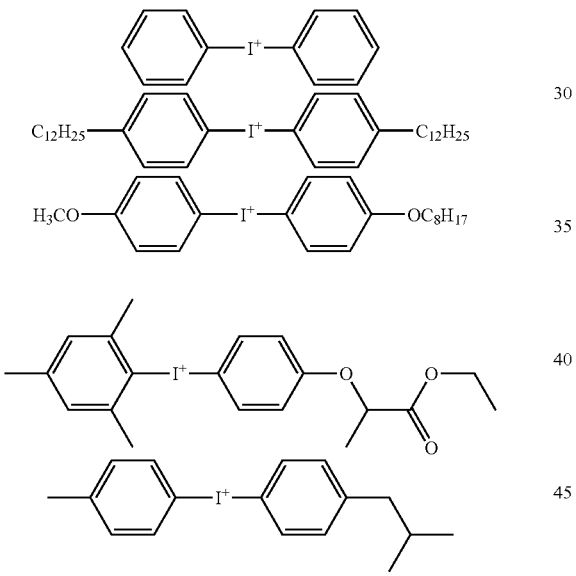

In the invention, other radical generating agents, for example, a sulfone compound, a halide compound and an iron arene complex, can be used in combination with the radical generating agent in the invention described above. Examples of the sulfone compound will be shown below.

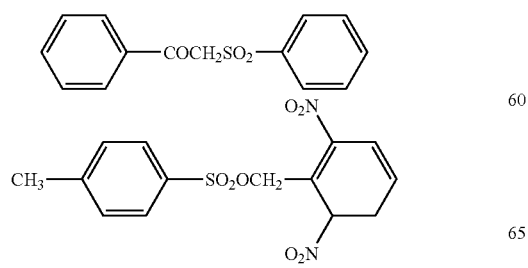

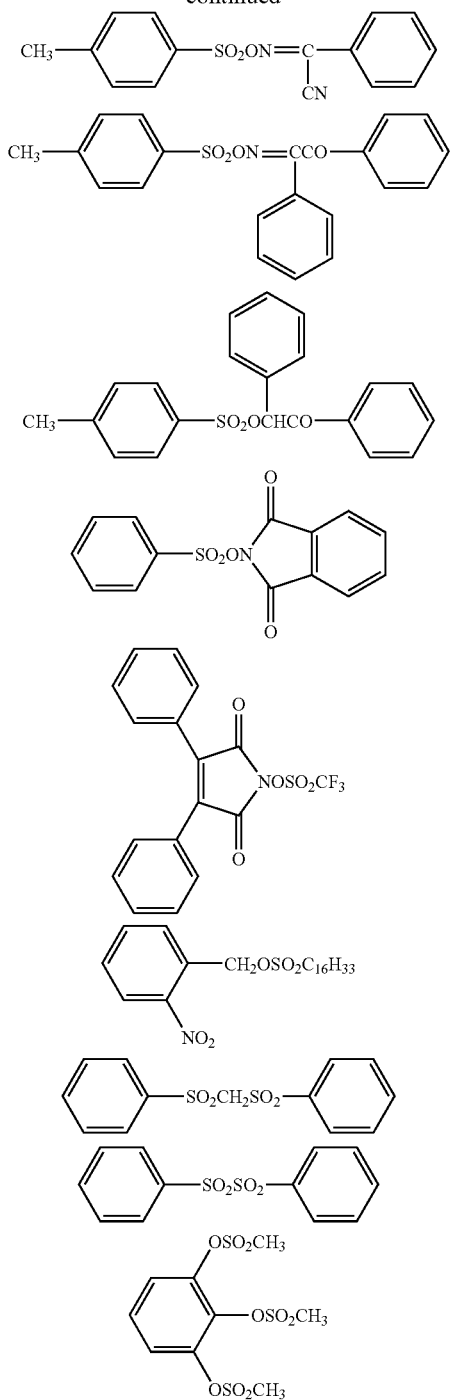

Examples of the halide compound will be shown below.

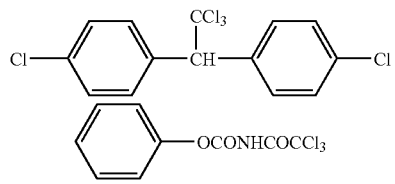

-continued

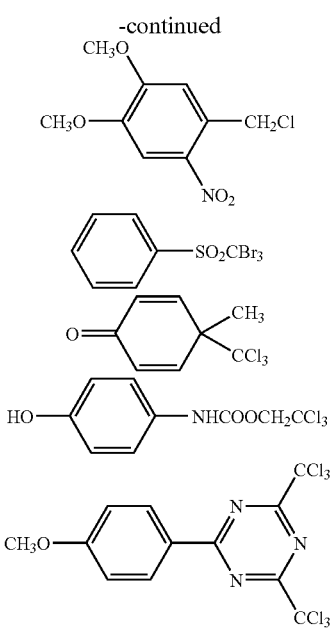

Examples of the iron allene complex will be shown below.

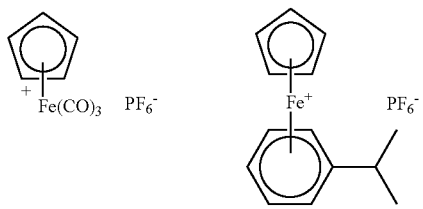

As the other radical generating agent, hexarylbiimidazoles (HABI, a dimer of triarylimidazole) can be also used which are disclosed in Japanese Patent O.P.I. Publication No. 2003-295426, EP 24,629, EP 107,792, U.S. Pat. No. 4,410,621, EP 215,453, and DE 3,211,312. Preferred examples thereof include 2,4,5,2',4',5'-hexaphenylbiimidazole, 2,2'-bis(2-chlorophenyl)-4,5,4',5'-tetraphenylbiimidazole, 2,2'-bis(2-bromophenyl)-4,5,4',5'-tetraphenylbiimidazole, 2,2'-bis(2,4-dichlorophenyl)-4,5,4',5'-tetraphenylbiimidazole, 2,2'-bis(2-chlorophenyl)-4,5,4',5'-tetrakis(3-methoxyphenyl)biimidazole, 2,2'-bis(2-chlorophenyl)-4,5,4',5'-tetrakis(3,4,5-trimethoxyphenyl) biimidazole, and 2,5,2',5'-tetrakis(2-chlorophenyl)-4,4'-bis (3,4-dimethoxyphenyl)biimidazole.

In the invention, a polyhalogen compound can be used in combination as the radical generating agent. As the polyhalogen compound, a compound represented by formula (3), (4), or (5) is preferred.

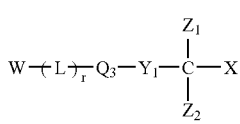

Formula (3)

wherein $Z_1$ and $Z_2$ independently are a halogen atom; X is a hydrogen atom or an electron-withdrawing group; $Y_1$ is —CO— or —SO$_2$—; $Q_3$ is an arylene group or a divalent heterocyclic group; L is a linkage group; W is a carboxyl group or its salt, a sulfo group or its salt, a phosphoric acid group or its salt, a hydroxyl group, a quaternary ammonium group or a polyethyleneoxy group; and r is 0 or 1.

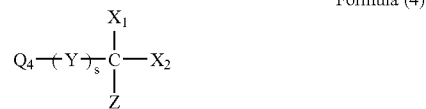

Formula (4)

wherein $Q_4$ is an alkyl group, an aryl group or a heterocyclic group; $X_1$ and $X_2$ are each a halogen atom; Z is a hydrogen atom or an electron-withdrawing group; Y is —C(=O)—, —SO— or —SO$_2$—; and s is 0 or 1.

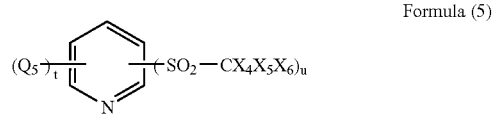

Formula (5)

wherein $Q_5$ is an alkyl group, an aryl group or a heterocyclic group; $X_4$, $X_5$ and $X_6$ are each a hydrogen atom or a halogen atom, provided that at least one of $X_4$, $X_5$ and $X_6$ is a halogen atom; t is an integer of 0 to 4; and u is an integer of 1 to 5.

Typical examples of the compounds represented by formula (3), (4) and (5) will be listed below, invention is not limited thereto.

(3-1)

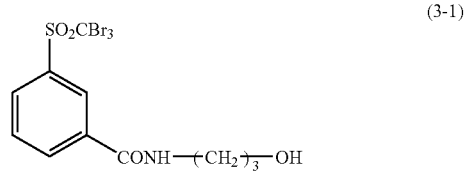

(3-2)

(3-3)

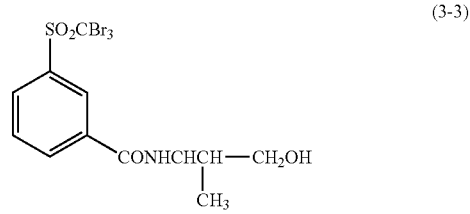

(3-4)

-continued
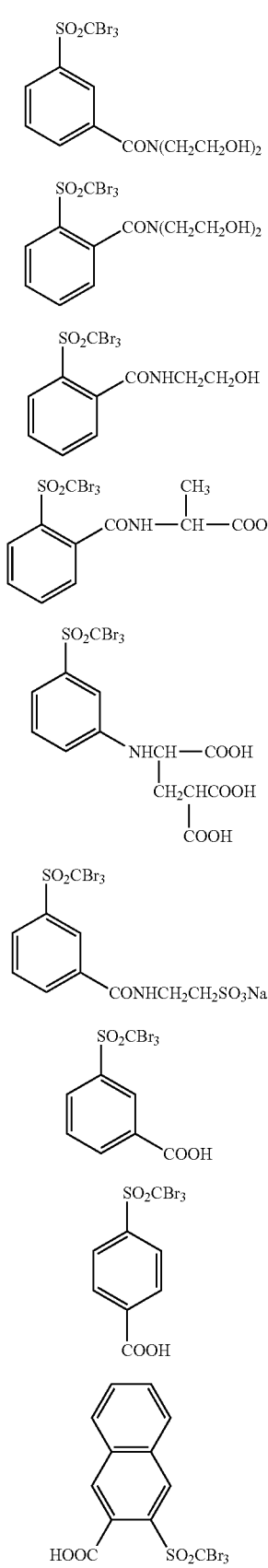
-continued
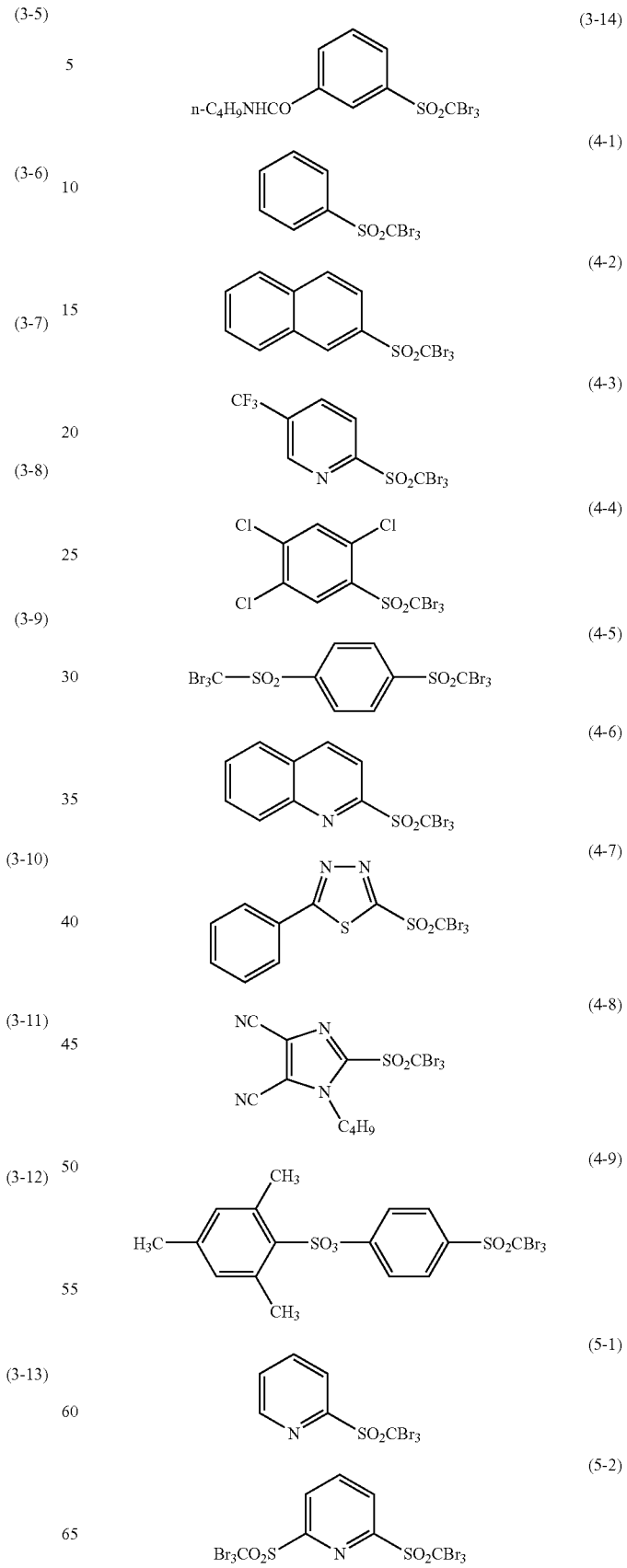

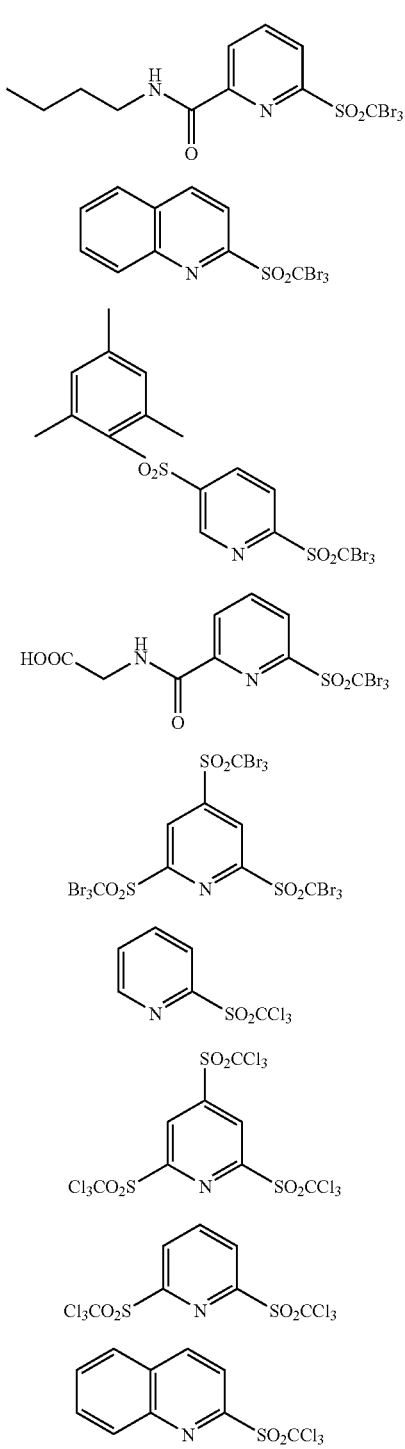

triazine, 2-methyl-4,6-bis(trichloromethyl)-s-triazine, 2-n-nonyl-4,6-bis(trichloromethyl)-s-triazine and 2-(α,α,β-trichloroethyl)-4,6-bis(trichloromethyl)-s-triazine. In addition to this, listed are compounds described in BP No. 1388492, for example, such as 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine and 2-(p-methoxystyryl)-4-amino-6-trichloromethyl-s-triazine; compounds described in JP-A No. 53-133428, for example, such as 2-(4-methoxy-naphtho-1-yl)-4,6-bis(trichloromethyl)-s-triazine, 2-(4-ethoxy-naphtho-1-yl)-4,6-bis(trichloromethyl)-s-triazine, 2-[4-(2-ethoxyethyl)-naphtho-1-yl]-4,6-bis(trichloromethyl)-s-triazine, 2-[4,7-dimethoxy-naphtho-1-yl]-4,6-bis(trichloromethyl)-s-triazine and 2-(acetonaphtho-5-yl)-4,6-bis(trichloromethyl)-s-triazine; and compounds described in German Patent No. 3337024. Further, listed are compounds described in J. Org. Chem., 29, 1527(1964) by F. C. Schaefer et. al., for example, such as 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine and 2-methoxy-4-methyl-6-trichloromethyl-s-triazine.

The content in the light sensitive layer of the radical generating agent in the invention is not specifically limited, but is preferably from 0.1 to 20% by weight, and more preferably from 0.8 to 15% by weight. The content in the light sensitive layer of other radical generating agents, which are optionally used in combination with the radical generating agent in the invention, is preferably from 0.1 to 20% by weight, and more preferably from 0.8 to 15% by weight.

(C) Radically Polymerizable Compound

The radically polymerizable compound used in the invention is an oxirane compound (hereinafter referred to also as the radically polymerizable oxirane compound in the invention), which has an oxirane ring in the molecule, and is radically polymerizable. As the radically polymerizable oxirane compound in the invention, there is an epoxy compound having an ethylenically unsaturated bond in the molecule. Examples thereof include an aliphatic epoxy group-containing unsaturated compound such as glycidyl (meth)acrylate, α-ethyl glycidyl (meth)acrylate, glycidyl crotoanate, glycidyl isocrotoanate, crotonyl glycidyl ether, itaconic acid monoalkyl monoglycidyl ester, fumalic acid monoalkyl monoglycidyl ester, or maleic acid monoalkyl monoglycidyl ester; and an alicyclic epoxy group-containing unsaturated compound such as 3,4-epoxycyclohexylmethyl (meth)acrylate.

The radically polymerizable compound in the invention may be a radically polymerizable prepolymer having an oxirane ring in the molecule. Examples thereof include an oligomer having an appropriate molecular weight having an oxirane ring modified with acrylic acid or methacrylic acid.

In the invention, the radically polymerizable compound is preferably a compound represented by formula (1) above. In formula (1), $R^1$ represents a hydrogen atom or a methyl group; $R^2$ represents a hydrogen atom or an alkyl group having a carbon atom number of not more than 6; and $X^1$ represents a single bond or a divalent organic linkage group. The alkyl group having a carbon atom number of not more than 6 represented by $R^2$ may be straight chained or branched (for example methyl, ethyl, propyl, n-butyl, i-butyl). The divalent organic linkage group represented by $X^1$ represents a straight chained or branched alkylene group having a carbon atom number of from 1 to 8 (for example, As a polyhalogen compound, a trihalomethyl triazine compound is preferably used in the invention. Listed are, for example, compounds described in Bull. Chem. Soc. Japan, 42, 2924 (1969), by Wakabayashi et. al., such as 2-phenyl-4,6-bis(trichloromethyl)-s-triazine, 2-(p-chlorophenyl)-4,6-bis(trichloromethyl)-s-triazine, 2-(p-tlyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s- methylene, ethylene, propylene, n-butylene, i-butylene), an alkylene group (for example, carbonylethylene, oxyethylene or thioethylene) in which a carbonyl group, an oxygen atom or a sulfur atom is intervened in the alkylene skeleton, an arylene group (for example, phenylene), or an aralkylene group (for example, ethylenephenylene).

Preferred examples of the radically polymerizable oxirane compound represented by formula (1) will be listed below.

M101
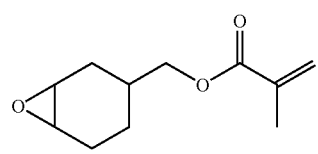

M102
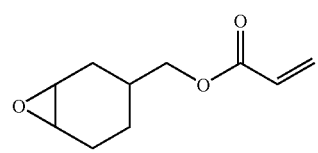

M103
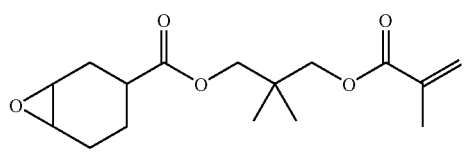

M104
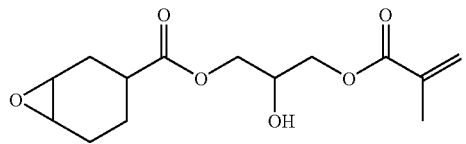

M105
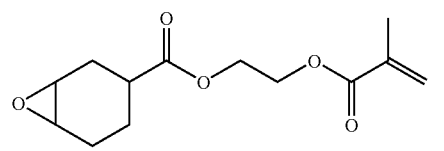

M106
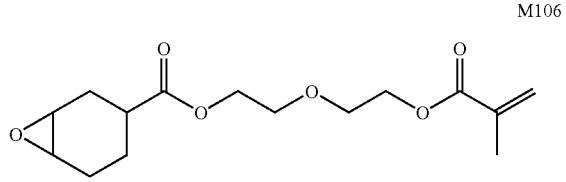

M107
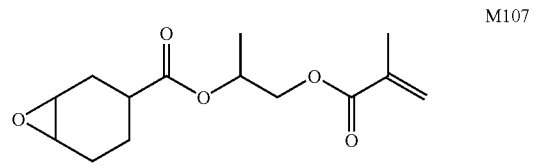

M108
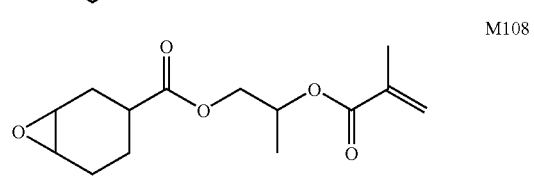

M109
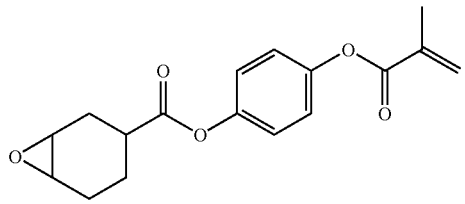

M110
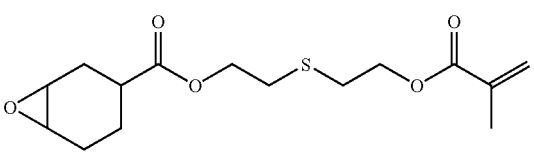

M111
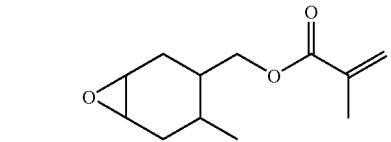

M112
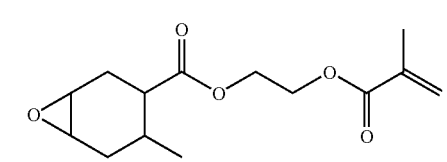

M113
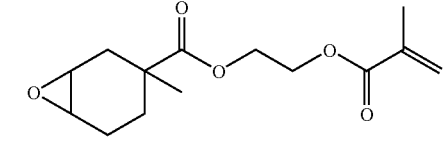

M114
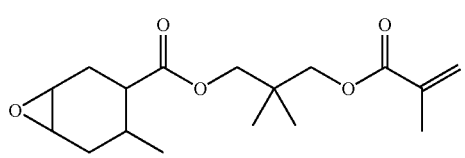

M115
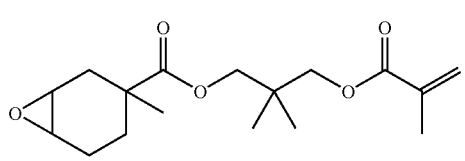

M116
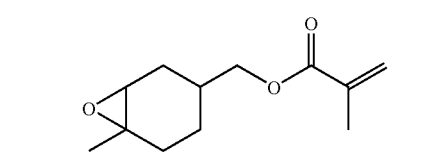

M201

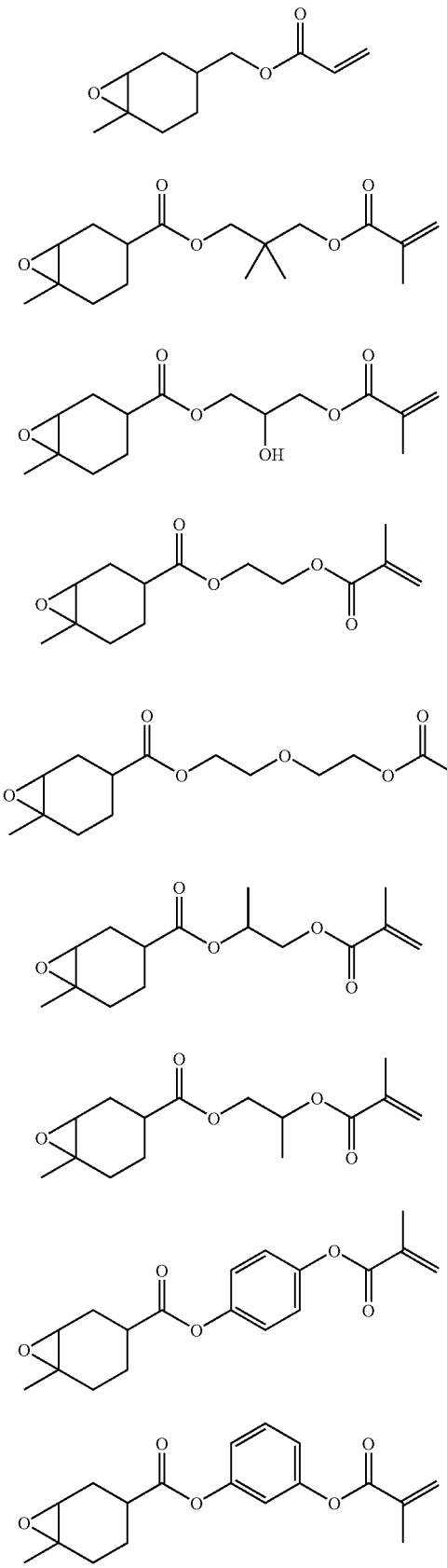

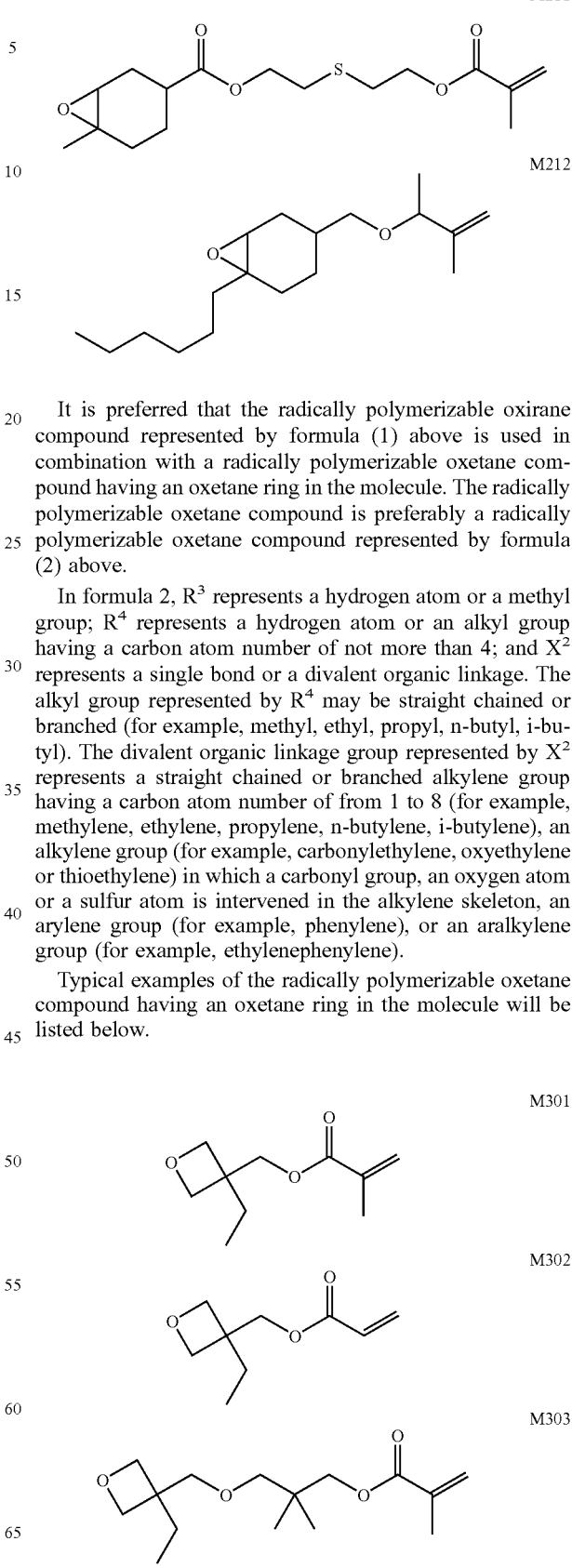

It is preferred that the radically polymerizable oxirane compound represented by formula (1) above is used in combination with a radically polymerizable oxetane compound having an oxetane ring in the molecule. The radically polymerizable oxetane compound is preferably a radically polymerizable oxetane compound represented by formula (2) above.

In formula 2, $R^3$ represents a hydrogen atom or a methyl group; $R^4$ represents a hydrogen atom or an alkyl group having a carbon atom number of not more than 4; and $X^2$ represents a single bond or a divalent organic linkage. The alkyl group represented by $R^4$ may be straight chained or branched (for example, methyl, ethyl, propyl, n-butyl, i-butyl). The divalent organic linkage group represented by $X^2$ represents a straight chained or branched alkylene group having a carbon atom number of from 1 to 8 (for example, methylene, ethylene, propylene, n-butylene, i-butylene), an alkylene group (for example, carbonylethylene, oxyethylene or thioethylene) in which a carbonyl group, an oxygen atom or a sulfur atom is intervened in the alkylene skeleton, an arylene group (for example, phenylene), or an aralkylene group (for example, ethylenephenylene).

Typical examples of the radically polymerizable oxetane compound having an oxetane ring in the molecule will be listed below.

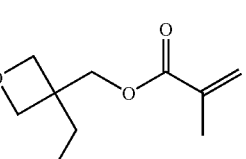

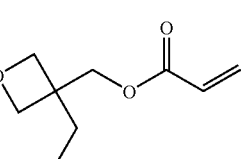

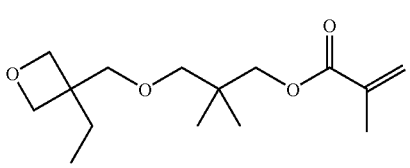

-continued

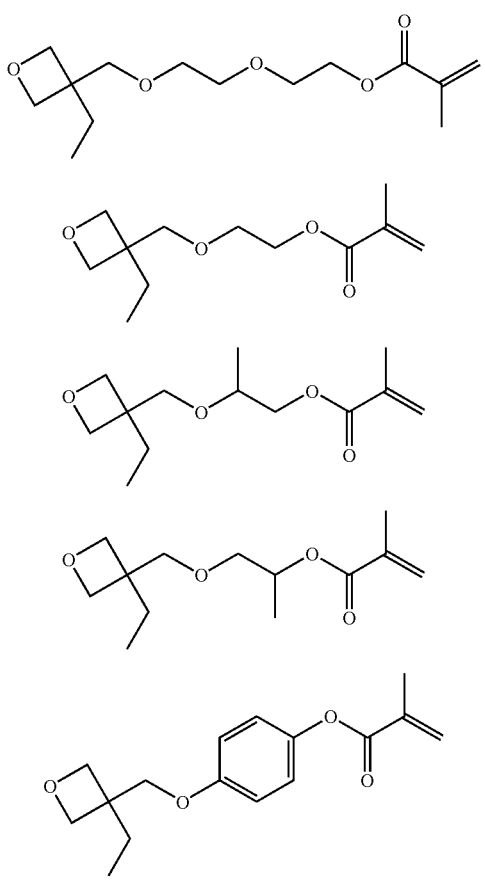

M304
M305
M306
M307
M308

In addition to the radically polymerizable compound described above, conventional addition polymerization compounds such as conventional radically polymerizable monomers, and polyfunctional monomers or oligomers having two or more of an ethylenic double bond in the molecule as generally used in an ultraviolet curable resin composition are preferably used.

These addition polymerization compounds are not specifically limited. Preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

Prepolymers can be used, and the prepolymers can be used singly, in combination, or as an admixture thereof with the above described monomers and/or oligomers.

Examples of the prepolymer include polyester (meth)acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin.(meth)acrylic acid obtained by incorporating (meth)acrylic acid in an epoxy resin; an urethaneacrylate such as ethylene glycol.adipic acid.tolylenediisocyanate.2-hydroxyethylacrylate, polyethylene glycol.tolylenediisocyanate-2-hydroxyethylacrylate, hydroxyethylphthalyl methacrylate.xylenediisocyanate, 1,2-polybutadieneglycol.tolylenediisocyanate.2-hydroxyethylacrylate or trimethylolpropane.propylene glycol.tolylenediisocyanate.2-hydroxyethylacrylate, obtained by incorporating (meth)acrylic acid in an urethane resin; a silicone acrylate such as polysiloxane acrylate, or polysiloxane.diisocyanate.2-hydroxyethylacrylate; an alkyd modified acrylate obtained by incorporating a methacroyl group in an oil modified alkyd resin; and a spiran resin acrylate.

There can be used a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate or a urethane modified acrylate; or an addition polymerizable oligomer or prepolymer having a structural unit derived from the above monomer.

The ethylenic monomer used in the invention is a phosphate compound having at least one (meth)acryloyl group. The phosphate compound is a compound having a (meth)acryloyl group in which at least one hydroxyl group of phosphoric acid is esterified.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV.EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

In the invention, an addition polymerizable ethylenically unsaturated monomer having a tertiary amino group in the molecule is preferably used. Its molecular structure is not limited, but those are preferred in which a tertiary amine having a hydroxyl group is modified with glycidyl methacrylate, methacrylic chloride, or acrylic chloride. Examples thereof include a polymerizable compound disclosed I Japanese Patent O.P.I. Publication Nos. 1-165613, 1-203413 and 1-197213.

A reaction product of a polyhydric alcohol having a tertiary amino group in the molecule, a diisocyanate and a compound having a hydroxyl group and an addition polymerizable ethylenically double bond in the molecule is preferably used in the invention.

Examples of the polyhydric alcohol having a tertiary amino group in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N, N', N'-tetra-2-hydroxypropylethylenediamine, p-tolyldiethanolamine, N,N, N', N'-tetra-2-hydroxyethylethylenediamine, N,N-bis (2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(l-isocyanato-1-methylethyl)benzene, but the invention is not specifically limited thereto.

Examples of the compound having a hydroxyl group and an addition polymerizable ethylenically double bond in the molecule include compounds MH-1 through MH-13 as described later. Preferred examples thereof include 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

The chemical structure of MH-1 through MH-13 will be shown below.

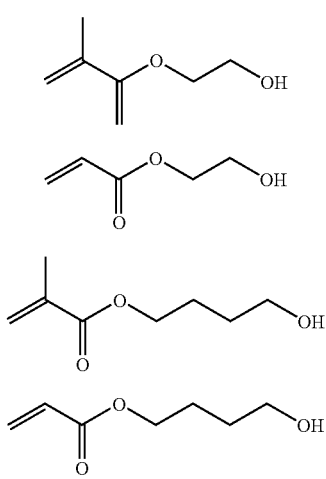

MH-1

MH-2

MH-3

MH-4

-continued

MH-5

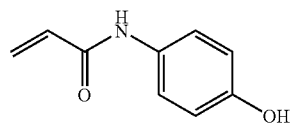

MH-6

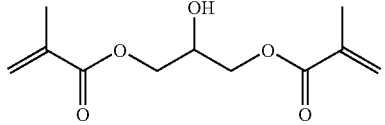

MH-7

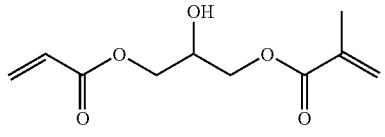

MH-8

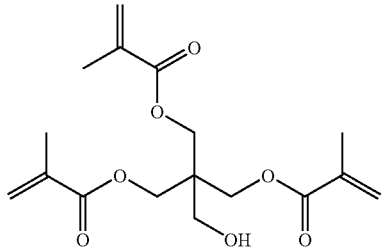

MH-9

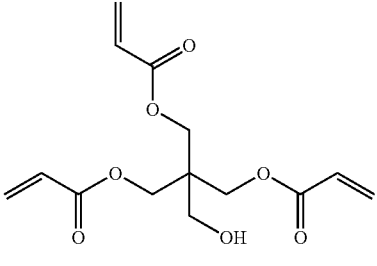

MH-10

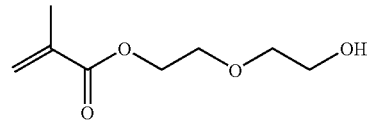

MH-11

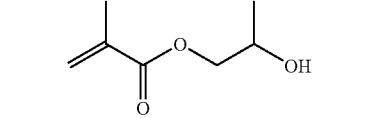

MH-12

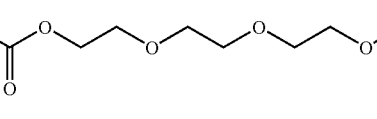

MH-13

The reaction product above can be synthesized according to the same method as a conventional method in which a urethaneacrylate compound is ordinarily synthesized employing an ordinary diol, a diisocyanate and an acrylate having a hydroxyl group.

Examples of the reaction product of a polyhydric alcohol having a tertiary amino group in the molecule, a diisocyanate and a compound having a hydroxy group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

M-6: A reaction product of triethanolamine (1 mole), 1,3-bis(1-cyanato-1-methylethyl)benzene (3 moles), and 2-hydroxyethyl methacrylate (3 moles)

M-7: A reaction product of ethylenediamine tetraethanol (1 mole), 1,3-bis(1-cyanato-1-methylethyl)benzene (4 moles), and 2-hydroxyethyl methacrylate (4 moles)

In addition to the above, acrylates or methacrylates disclosed in Japanese Patent O.P.I. Publication Nos. 1-105238 and 2-127404 can be used.

The content of the radically polymerizable oxirane compound in the invention in the light sensitive layer is preferably from 30 to 70% by weight, and more preferably from 40 to 60% by weight, based on the total solid components of light sensitive layer. The content of the oxirane compound represented by formula (1) is preferably not less than 1% by weight, more preferably not less than 10% by weight, and still more preferably from 20 to 95% by weight, based on the content of the radically polymerizable oxirane compound in the invention in the light sensitive layer. The content of the oxetane compound represented by formula (2) is preferably from 5 to 80% by weight, and more preferably from 10 to 50% by weight, based on the content of the radically polymerizable oxirane compound in the invention in the light sensitive layer.

The light sensitive layer of the planographic printing plate material of the invention can contain a polymer binder for carrying other components in the light sensitive layer.

(Polymer Binder)

As the polymer binder in the invention can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

The polymer binder used in the invention is preferably a vinyl copolymer obtained by copolymerization of an acryl monomer, and more preferably a copolymer containing (i) a carboxyl group-containing monomer unit and (ii) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

1) A monomer having an aromatic hydroxy group, for example, o-, (p- or m-) hydroxystyrene, or o-, (p- or m-) hydroxyphenylacrylate;

2) A monomer having an aliphatic hydroxy group, for example, 2-hydroxyethyl acrylate, 2-hydroxyethyl methacrylate, N-methylolacrylamide, N-methylolmethacrylamide, 4-hydtoxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

4) A monomer having a sulfonamido group, for example, N- (p-toluenesulfonyl) acrylamide, or N- (p-toluenesulfonyl) -methacrylamide;

5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

7) A vinyl ether, for example, ethyl vinyl ether, 2-chloroethyl vinyl ether, propyl vinyl ether, butyl vinyl ether, octyl vinyl ether, or phenyl vinyl ether;

8) A vinyl ester, for example, vinyl acetate, vinyl chroloacetate, vinyl butyrate, or vinyl benzoate;

9) A styrene, for example, styrene, methylstyrene, or chloromethystyrene;

10) A vinyl ketone, for example, methyl vinyl ketone, ethyl vinyl ketone, propyl vinyl ketone, or phenyl vinyl ketone;

11) An olefin, for example, ethylene, propylene, isobutylene, butadiene, or isoprene;

12) N-vinylpyrrolidone, N-vinylcarbazole, or N-vinylpyridine,

13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer.

As the polymer binder is also preferred an unsaturated bond-containing copolymer which is obtained by reacting a carboxyl group contained in the above vinyl copolymer molecule with for example, a compound having a (meth) acryloyl group and an epoxy group.

Examples of the compound having an unsaturated bond and an epoxy group in the molecule include glycidyl acrylate, glycidyl methacrylate and an epoxy group-containing unsaturated compound disclosed in Japanese Patent O.P.I. Publication No. 11-27196.

The weight average molecular weight of the above copolymer is preferably 10,000 to 200,000 measured by gel permeation chromatography (GPC).

The content of the polymer binder in the light sensitive layer is preferably from 10 to 90% by weight, more preferably from 15 to 70% by weight, and still more preferably from 20 to 50% by weight, in view of sensitivity.

The acid value of the polymer binder is preferably from 10 to 150, more preferably from 30 to 120, and still more preferably from 50 to 90, in view of balance of polarity of the light sensitive layer, which can prevent coagulation of pigment used in the photopolymerizable light sensitive layer coating liquid.

The light sensitive layer in the invention is preferably added with a polymerization inhibitor, in order to prevent undesired polymerization of the ethylenically unsaturated monomer during the manufacture or after storage of planographic printing plate material. Examples of the polymerization inhibitor include hydroquinone, p-methoxyphenol, di-t-butyl-p-cresol, pyrrogallol, t-butylcatechol, benzoquinone, 4,4'-thiobis (3-methyl-6-t-butylphenol), 2,2'-methylenebis (4-methyl-6-t-butylphenol), N-nitrosophenylhydroxylamine cerous salt, and 2-t-butyl-6-(3-t-butyl-6-hydroxy-5-mrthylbenzyl)-4-methylphenyl acrylate.

The polymerization inhibitor content is preferably 0.01 to 5% by weight based on the total solid content of the light sensitive layer. Further, in order to prevent undesired polymerization induced by oxygen, behenic acid or a higher fatty acid derivative such as behenic amide may be added to the layer. After the light sensitive layer is coated layer, the coated layer may be dried so that the higher fatty acid derivative is localized at the vicinity of the surface of the light sensitive layer. The content of the higher fatty acid derivative is preferably 0.5 to 10% by weight, based on the total solid content of the light sensitive layer.

A colorant can be also used. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran". Pigment is preferred.

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment). Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

A surfactant may be added to the light sensitive layer in order to improve coatability of the layer. A preferred surfactant is a fluorine-contained surfactant.

Further, in order to improve physical properties of the cured light sensitive layer, the layer can contain an inorganic filler or a plasticizer such as dioctyl phthalate, dimethyl phthalate or tricresyl phosphate. The content of such a material is preferably not more than 10% by weight, based on the total solid content of the light sensitive layer.

The solvents used in the preparation of the coating liquid for the light sensitive layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

In the planographic printing plate material of the invention, an oxygen shielding layer, which is provided on a light sensitive layer of a conventional radically polymerizable light sensitive planographic printing plate material is not necessary. In the conventional radically polymerizable light sensitive planographic printing plate material employing a conventional radically polymerizable compound, an oxygen shielding layer (which serves also as a protective layer), which prevents oxygen permeation and has high solubility to a developer (generally alkali solution) described later, is provided on the light sensitive layer, whereby undesired polymerization during storage is restrained and high storage stability of the planographic printing plate material is secured. The light sensitive planographic printing plate material of the invention, employing the oxirane compound in the invention, particularly the oxirane compound containing an aliphatic epoxy moiety or the oxirane compound represented by formula (1) which is less reactive to oxygen, requires no oxygen shielding layer on the light sensitive layer.

The light sensitive layer in the invention contains (A) an infrared absorbing dye, (B) a radical generating agent, and (C) a radically polymerizable compound, and optionally contains a polymer binder or other components described above. The light sensitive layer is provided on a support to obtain the planographic printing plate material of the invention.

The support used in the invention is a plate or a sheet capable of carrying the light sensitive layer and preferably has a hydrophilic surface on the side on which the light sensitive layer is to be provided.

As the supports used in the invention, a plate of a metal such as aluminum, stainless steel, chromium or nickel, or a plastic film such as a polyester film, a polyethylene film or a polypropylene film, which is deposited or laminated with the above-described metal can be used. Further, a polyester film, a polyvinyl chloride film or a nylon film whose surface is subjected to hydrophilization treatment can be used. Among the above, the aluminum plate is preferably used, and may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron. In the aluminum plate for the support, the surface is roughened for water retention.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as, kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable.

Though there is no restriction for the electrolytic surface roughening method, a method, in which the support is electrolytically surface roughened in an acidic electrolytic solution, is preferred.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support.

The support, which has been subjected to anodizing treatment, is optionally subjected to sealing treatment. For the sealing treatment, it is possible to use known methods using hot water, boiling water, steam, a sodium silicate solution, an aqueous dichromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye; an amine salt; and so on, for hydrophilization treatment. The sol-gel treatment support disclosed in Japanese Patent O.P.I. Publication No. 5-304358, which has a functional group capable of causing addition reaction by radicals as a covalent bond, is suitably used.

In the invention, the light sensitive layer is formed by preparing a coating liquid for the light sensitive layer and coating the liquid on the support according to a coating conventional method, and drying, whereby a planographic printing plate material is obtained. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A drying temperature of the coated light sensitive layer is preferably from 60 to 160° C., more preferably from 80 to 140° C., and still more preferably from 90 to 120° C., in view of fog occurrence at non-image portions.

As light sources for forming an image on the planographic printing plate material in the invention, laser having an emission wavelength in the infrared to near infrared regions can be used.

When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

As the laser, YAG laser or semi-conductor laser is preferably used. In the invention, a laser being capable of emitting light with an emission wavelength from 700 to 1200 nm is preferred in efficiently displaying the effects of the invention.

As a laser scanning method by means of a laser beam, there are a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straighta part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium.

The method of scanning an outer surface of a cylinder is especially preferred, since the optical system is easily designed and it is possible to reduce the distance between the planographic printing plate material and the light source in efficiently utilizing laser energy.

In the invention, the exposed planographic printing plate material can be subjected to heat treatment before or during development. Such a heat treatment may provide a slight increase in sensitivity and printing durability. However, the heat treatment is not always necessary, since sufficient performances can be obtained without heat treatment.

Regarding heat treatment, there is, for example, a developing machine in which a preheating roller for preheating an exposed planographic printing plate material to a predetermined temperature is arranged upstream a development section where the preheating is carried out before development. The preheating roller is a roller comprised of a pair of rollers, at least one of the pair of the rollers having a heating means within the roller. The roller having a heating means in it is a pipe of a metal with high thermal conductivity such as aluminum or iron, the pipe having a nichrome wire as a heating element. The outside surface of the pipe may be covered with a sheet of a plastic such as polyethylene, polystyrene or Teflon. Details of such a preheating roller can refer to Japanese Patent O.P.I. Publication No. 64-80962. In the invention, it is preferred that the preheating is carried out at 70 to 180° C. for 3 to 120 seconds.

In the invention, the imagewise exposed light sensitive layer, which are cured are at exposed portions, is developed with an alkali developer, whereby the light sensitive layer at exposed portions are removed to form an image.

As the alkali developer, a conventional alkali aqueous solution is used. For example, there is an alkali developer containing an inorganic alkali agent such as sodium silicate, potassium silicate; ammonium silicate, sodium secondary phosphate, potassium secondary phosphate, ammonium secondary phosphate; sodium hydrogen carbonate, potassium hydrogen carbonate, ammonium hydrogen carbonate; sodium carbonate, potassium carbonate, ammonium carbonate; sodium borate, potassium borate, lithium borate; sodium hydroxide, potassium hydroxide, and ammonium hydroxide.

The alkali developer can contain organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents can be used singly or as a mixture of two or more thereof. The alkali developer can contain an anionic surfactant, an amphoteric surfactant, or an organic solvent such as alcohol.

In the invention the preferred alkali developer used in the preparation of a printing plate is an aqueous solution having a silicate content of from 1.0 to 4.0% by weight in terms of $SiO_2$ concentration, and having a pH of from 8.5 to 12.5. The aqueous solution can contain another additive. It is preferred that the aqueous solution further contains a surfactant in an amount of from 0.1 to 5.0% by weight.

It is desirable that the planographic printing plate material of the invention is washed with water before processed in an automatic processor, or is processed in an automatic processor in which a pre-washing tank is provided upstream a developing tank.

Washing water (pre-washing water) used before development is ordinarily common water, and may contain a chelating agent or an antiseptic agent.

Development may be carried out immediately after the pre-washing before development or after pre-washing and drying.

The developed planographic printing plate material is subjected to post-processing in which the developed material is processed with washing water, a rinsing solution containing a surfactant, or a finisher or a gumming solution containing gum arabic or starch derivatives.

The gumming solution contains preferably an acid or a buffering agent for removing the alkali of developer remaining on the surface of the planographic printing plate material, and may contain a hydrophilic polymer, a chelating agent, a lubricant, an antiseptic agent, a solubilizing agent, a surfactant, or a wetting agent. The hydrophilic polymer of the gumming solution functions as a protective agent for preventing scratches or stain produced on the surface of the developed planographic printing plate material. The thickness of the gumming film can be controlled by the squeegee condition of the automatic processor. The coating amount of the gumming solution is from 1 to 10 $g/m^2$.

Drying is carried out after post-processing employing a known heater such as a heater blowing warm air, or an far infrared heater. In the drying, the solvent of the gumming solution is completely evaporated.

EXAMPLES

Next, the present invention will be explained in the following examples, but the present invention is not limited thereto. In the examples, "parts" represents "parts by weight", unless otherwise specified.

(Synthesis of Polymer Binder)

<<Synthesis of Acryl Copolymer 1>>

Thirty parts of methacrylic acid, 50 parts of methyl methacrylate, 20 parts of ethyl methacrylate, 500 parts of isopropyl alcohol, and 3 parts of α,α'-azobisisobutyro-nitrile were put in a three neck flask under nitrogen atmosphere, and reacted under nitrogen atmosphere for 6 hours at 80° C. in an oil bath. After that, the reaction mixture was refluxed at a boiling point of isopropyl alcohol for one hour, and 3 parts of triethylbenzylammonium chloride and 25 parts of glycidyl methacrylate were further added to the mixture, and reacted for additional 3 hours. Thus, acryl copolymer 1 was obtained. The weight average molecular weight of the acryl copolymer 1 was 35,000, measured according to GPC. The glass transition temperature Tg of the acryl copolymer 1 was 85° C., measured according to DSC (differential thermal analysis).

(Preparation of Support)

A 0.3 mm thick aluminum plate (material 1050, refining H16) was degreased at 60° C. for one minute in a 5% sodium hydroxide solution, washed with water, immersed at 25° C. for one minute in 10% hydrochloric acid solution to neutralize, and then washed with water. The resulting aluminum plate was electrolytically etched using an alternating current at 25° C. for 60 seconds at a current density of 100 $A/dm^2$ in a 0.3 weight % nitric acid solution, desmut at 60° C. for 10 seconds in a 5% sodium hydroxide solution. The desmut aluminum plate was anodized at 25° C. for 1 minute at a current density of 10 $A/dm^2$ and at a voltage of 15 V in a 15% sulfuric acid solution, and further subjected to hydrophilization at 75° C. in a 1% polyvinyl phosphonic acid solution. Thus, support 1 was obtained. The center line average surface roughness (Ra) of the support was 0.65 μm. The center line average surface roughness (Ra) was measured through a surface roughness meter RST/PLUS (produced by WYKO Co., LTD).

(Preparation of Planographic Printing Plate Material Sample)

The following light sensitive layer coating solution 1 was coated on the resulting support through a wire bar, and dried at 95° C. for 1.5 minutes to give a light sensitive layer having a dry thickness of 1.5 g/m². Thus, light sensitive planagraphic printing plate material samples 1 through 18 (inventive) and light sensitive planographic printing plate comparative samples 1 through 6 were obtained.

(Light Sensitive Layer Coating Solution 1)

Radically Polymerizable compound amount as shown in Table 1 (as shown in Table 1)

| | |
|---|---|
| Polymerization initiator 1 | 2.0 parts |
| Polymerization initiator 2 | 1.0 part |
| Polymerization initiator 3 | 3.0 parts |
| Polymerization initiator 4 | 4.0 parts |
| Cyanine dye D-1 | 2.5 parts |
| Acryl copolymer 1 | 40.0 parts |
| N-Phenylglycine benzyl ester | 4.0 parts |
| Phthalocyanine pigment (MHI #454 produced by Mikuni Sikisosha) | 6.0 parts |
| 2-t-Butyl-6-(3-t-butyl-2-hydroxy-5-methylbenzyl)-4-methylphenylacrylate (Sumirizer GS: produced by Sumitomo 3M Co., Ltd.) | 0.5 parts |
| Fluorine-contained surfactant (F-178K: produced by Dainippon Ink Co., Ltd.) | 0.5 parts |
| Methyl ethyl ketone | 80 parts |
| Cyclohexanone | 820 parts |

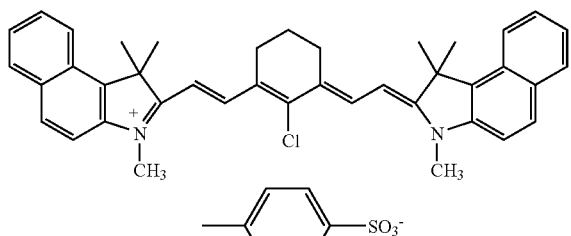

Cyanine dye D-1

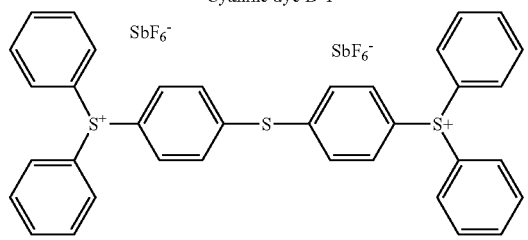

Polymerization initiator 1

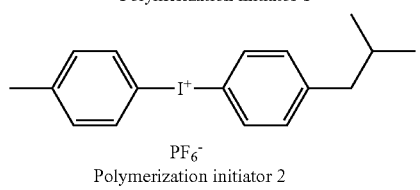

Polymerization initiator 2

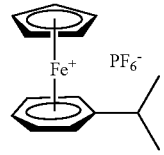

Polymerization initiator 3

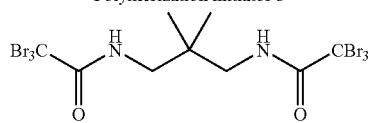

Polymerization initiator 4

(Evaluation of Light Sensitive Planographic Printing Plate Material Sample)

The light sensitive planographic printing plate material sample obtained above was imagewise exposed at a resolving degree of 2400 dpi, employing a plate setter (Trend setter produced by Creo Co., Ltd.) equipped with a 830 nm light source). Herein, dpi represents the dot numbers per 2.54 cm.

The image pattern used for the exposure comprised a solid-image and a square dot image with a screen number of 175 LPI (LPI means a line number per 2.54 cm) and a 50% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, planographic printing plate samples 1 through 18 (inventive) and planographic printing plate comparative samples 1through 6 were obtained.

Comparative samples 4, 5, and 6, after exposure, were pre-heated at 105° C. for 30 seconds in a thermostat and then subjected to development as above.

<Composition of Developer (Aqueous Solution Containing the Following Components)>

| | |
|---|---|
| Potassium silicate aqueous solution (containing 25.5–27.5% by weight of SiO₂ and 12.5–14.5% by weight of K₂O) | 8.0% by weight |
| Newcol B-13SN (produced by Nippon Nyukazai Co., Ltd.) | 3.0% by weight |
| Potassium hydroxide | amount giving pH 12.3 |

(Sensitivity)

The lowest exposure energy amount (μJ/cm²) reproducing the solid image above in the resulting planographic printing plate with no reduction of the layer thickness at the solid image portions was defined as recording energy and evaluated as a measure of sensitivity. The less the recording energy is, the higher the sensitivity. The results are shown in Table 1.

(Printing Durability)

The printing plate material sample obtained above was exposed at an exposure amount of 100 mJ/cm$^2$, employing an image with a screen line number of 175, and developed with the developer, whereby a printing plate was obtained. Employing the resulting printing plate, printing was carried out on a press (PAIYA1F-1 produced by Mitsubishi Jukogyo Co., Ltd.), wherein a coat paper, printing ink (Soybean oil ink, "Naturalith 100" produced by Dainippon Ink Kagaku Co., Ltd.), and dampening water (SG-51, H solution produced by Tokyo Ink Co., Ltd., Concentration: 1.5%) were used. The number of prints printed time when printing started until time when dot reduction at highlight portions was defined as a measure of printing durability. The results are shown in Table 1.

merizable compound is a radically polymerizable oxirane compound represented by the following formula (1),

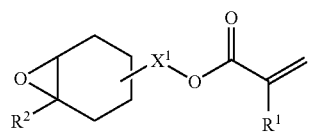

Formula (1)

wherein R$^1$ represents a hydrogen atom or a methyl group; R$^2$ represents a hydrogen atom or an alkyl group having a carbon atom number of not more than 6; and X$^1$ represents a single bond, a straight chained or branched alkylene group having a carbon atom number of from 1 to 8, an alkylene group in which a carbonyl group, an oxygen atom or a sulfur atom is intervened in the alkylene skeleton, an arylene group or an aralkylene group.

TABLE 1

| Sample No. | Radically polymerizable compound in the invention (parts by weight) | Radically polymerizable compound used in combination (parts by weight) | | Pre-heating | Exposure energy (mJ/cm$^2$) | Printing durability (Sheet Number) |
|---|---|---|---|---|---|---|
| 1 (Inv.) | M101 (15) | *1 (15) | *2 (15) | No | 170 | 180,000 |
| 2 (Inv.) | M103 (15) | *1 (15) | *2 (15) | No | 170 | 200,000 or more |
| 3 (Inv.) | M105 (15) | *1 (15) | *2 (15) | No | 160 | 200,000 or more |
| 4 (Inv.) | M111 (15) | *1 (15) | *2 (15) | No | 180 | 180,000 |
| 5 (Inv.) | M113 (15) | *1 (15) | *2 (15) | No | 180 | 140,000 |
| 6 (Inv.) | M114 (15) | *1 (15) | *2 (15) | No | 180 | 150,000 |
| 7 (Inv.) | M115 (15) | *1 (15) | *2 (15) | No | 180 | 150,000 |
| 8 (Inv.) | M201 (15) | *1 (15) | *2 (15) | No | 200 | 150,000 |
| 9 (Inv.) | M205 (15) | *1 (15) | *2 (15) | No | 200 | 150,000 |
| 10 (Inv.) | M101 (10) M301 (5) | *1 (25) | *3 (5) | No | 150 | 200,000 or more |
| 11 (Inv.) | M103 (10) M301 (5) | *1 (25) | *3 (5) | No | 150 | 200,000 or more |
| 12 (Inv.) | M105 (10) M301 (5) | *1 (25) | *3 (5) | No | 150 | 200,000 or more |
| 13 (Inv.) | M111 (10) M301 (5) | *1 (25) | *3 (5) | No | 160 | 200,000 or more |
| 14 (Inv.) | M113 (10) M301 (5) | *1 (25) | *3 (5) | No | 160 | 150,000 |
| 15 (Inv.) | M114 (10) M301 (5) | *1 (25) | *3 (5) | No | 150 | 150,000 |
| 16 (Inv.) | M115 (10) M301 (5) | *1 (25) | *3 (5) | No | 150 | 150,000 |
| 17 (Inv.) | M201 (10) M301 (5) | *1 (25) | *3 (5) | No | 170 | 170,000 |
| 18 (Inv.) | M205 (10) M301 (5) | *1 (25) | *3 (5) | No | 170 | 170,000 |
| 1 (Comp.) | None | *1 (25) | *3 (5) | No | 300 or more | ** |
| 2 (Comp.) | None | *1 (25) | *3 (5) | No | 300 or more | ** |
| 3 (Comp.) | None | *1 (25) | *3 (5) | No | 300 or more | ** |
| 4 (Comp.) | None | *1 (25) | *3 (5) | Yes | 250 | 30,000 |
| 5 (Comp.) | None | *1 (25) | *3 (5) | Yes | 230 | 60,000 |
| 6 (Comp.) | None | *1 (25) | *3 (5) | Yes | 230 | 50,000 |

Inv.: Inventive
Comp.: Comparative
** Printing could not be carried out.
In Table 1,
*1 represents a reaction product of n-butyldiethanolamine (1 mol), tetramethylxylylene diisocyanate (2 mol), and 1-methacroyloxy-3-acryloyloxy-2-prppanol (2 mol),
*2 represents a reaction product of hexane-1,6-diisocyanate (1 mol) and 2-hydroxypropylene-1,3-dimethacrylate (2 mol), and
*3 represents tetraethylene glycol dimethacrylate.

As is apparent from Table 1, the inventive planographic printing plate material samples require no heat treatment after exposure, and provide high sensitivity and high printing durability.

What is claimed is:

1. A light sensitive planographic printing plate material comprising a hydrophilic support and provided thereon, a light sensitive layer containing (A) an infrared absorbing dye, (B) a radical generating agent, and (C) a radically polymerizable compound, the light sensitive layer being an outermost layer, wherein the radical generating agent is selected from the group consisting of a sulfonium salt, a iodonium salt and a diazonium salt, and the radically polymerizable compound is a radically polymerizable oxirane compound represented by the following formula (1), 2. The light sensitive planographic printing plate material of claim 1, wherein the light sensitive layer further contains a radically polymerizable oxetane compound having an oxetane ring in the molecule as the radically polymerizable compound.

3. The light sensitive planographic printing plate material of claim 2, wherein the oxetane compound is an oxetane compound represented by the following formula (2),

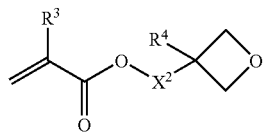

Formula (2)

wherein R³ represents a hydrogen atom or a methyl group; R⁴ represents a hydrogen atom or an alkyl group having a carbon atom number of not more than 4; and X² represents a single bond, a straight chained or branched alkylene group having a carbon atom number of from 1 to 8, an alkylene group in which a carbonyl group, an oxygen atom or a sulfur atom is intervened in the alkylene skeleton, an arylene group or an aralkylene group.

4. The light sensitive planographic printing plate material of claim 1, wherein the light sensitive layer contains the infrared absorbing dye in an amount of from 0.5 to 15% by weight, the radical generating agent in an amount of from 0.1 to 20% by weight, and the radically polymerizable oxirane compound in an amount of from 30 to 70% by weight.

5. The light sensitive planographic printing plate material of claim 1, wherein the light sensitive layer further contains a polymer binder.

6. The light sensitive planographic printing plate material of claim 1, wherein the infrared absorbing dye is a dye having an absorption band in an infrared wavelength region of from 700 to 1200 nm.

7. The light sensitive planographic printing plate material of claim 6, wherein the infrared absorbing dye is a cyanine dye.

8. The light sensitive planographic printing plate material of claim 1, wherein the light sensitive layer further contains, as the radical generating agent, a sulfone compound, a halogen compound or an iron arene complex.

* * * * *